United States Patent [19]

Urschel et al.

[11] Patent Number: 4,673,917
[45] Date of Patent: Jun. 16, 1987

[54] METHOD AND APPARATUS FOR MINIMIZING DIGITAL-TO-ANALOG CONVERTER CORRECTION TRIMS

[75] Inventors: William J. Urschel, Yellow Springs, Ohio; Edwin A. Sloane, Los Altos, Calif.

[73] Assignee: Fairchild Semiconductor Corporation, Cupertino, Calif.

[21] Appl. No.: 631,958

[22] Filed: Jul. 18, 1984

[51] Int. Cl.$^4$ .............................................. H03M 1/10
[52] U.S. Cl. ...................... 340/347 CC; 340/347 DA; 364/727
[58] Field of Search ................. 340/347 CC, 347 DA; 364/727; 371/25, 26; 338/195

[56] References Cited

PUBLICATIONS

Pau, "Fast Testing & Trimming of A/D and D/A Converters in Automatic Test Systems", paper presented at 1978 IEEE Autotest, pp. 268-274.

Primary Examiner—Charles D. Miller
Attorney, Agent, or Firm—Theodore S. Park; Bruce D. Riter; Charles E. Krueger

[57] ABSTRACT

A method of calibrating a feed forward, DAC post-correction system. The method includes fitting the Walsh co-efficiencts of a DAC transfer function to a straight line in the log domain. The deviation of these terms in the log domain is utilized to compute Walsh correction terms for use in the post correction system.

4 Claims, 20 Drawing Figures

CORRECTION BLOCK DIAGRAM

FIG._5A. *PRIOR ART*

DISCRETE CORRECTION TOPOLOGY

CORRECTION IMPLEMENTATION
BLOCK DIAGRAM

FIG._10.

METHOD AND APPARATUS FOR MINIMIZING DIGITAL-TO-ANALOG CONVERTER CORRECTION TRIMS

BACKGROUND OF THE INVENTION

1. Field of the Invention

The present invention relates generally to a digital-to-analog converter (DAC) and, more particularly, to a method and apparatus for improving the accuracy of a DAC.

2. Description of the Prior Art

Over the past decade, tremendous changes have occurred in the implementation of electronic devices, due primarily to advances in processing techniques which presently allow the compression of entire electronic systems onto single chips, or small combinations of chips, on ceramic substrates. This compression has led to the development of the microprocessor which is a computer formed on a single semiconductor chip. Controllers using microprocessors are currently being used in many systems. Typically, the controller receives analog signals indicating a state of the system. The values of these analog signals are converted to digital numbers which are subsequently processed by the microprocessor. The digital output of the microprocessor indicates the value of control signals which may be utilized to alter the state of the system. The actual control signals that alter the state of the system are usually analog voltage or current signals. Thus, a digital to analog converter (DAC) is required to generate analog signals having the values specified by the digital output of the microprocessor.

The above-described improvements in the implementation of electronic devices have also affected the construction of DACs. Presently, entire DACs with interface and control circuit can be implemented in a single package and multiple converters now share the same on-chip data buses and reference voltage sources.

Unfortunately, although this compression of package size has created a flexibility in the implementation of DACs and their interface components, a comparable advance in DAC accuracy has not also been achieved. For example, sixteen-bit DACs complete with latches, reference voltage source, output amplifier, and scaling circuitry are available in twenty-eight to forty pin packages. Absolute accuracy, however, is still limited to about fourteen bits. Accordingly, there exists a compelling need to improve the accuracy of monolithic DACs.

Presently, most DACs are implemented by a resistor network for current or voltage switching. The performance of a DAC is modeled by a transfer characteristic which specifies the analog output of the DAC as a function if its digital input. Ideally, the transfer characteristic is a straight line with the slope of the line being the gain of the DAC. A realizable DAC will have a transfer characteristic which deviates from the ideal. This deviation is described by three forms of static error which are:

Offset—a deviation of the zero intercept of the transfer characteristic from the ideal;

Range—a deviation of the full scale value of the transfer characteristic from the predicted end point value (another measurement of this error is the deviation of the gain (slope) from the ideal transfer characteristic);

Non-linearity—a deviation of the transfer function from a straight line drawn through its end point, not including errors due to offset and range effects.

Presently, conventional static error correction techniques rely on generating the actual transfer characteristic of the DAC, forming a straight line between the end points of the actual transfer characteristic, determining the error function, i.e., the difference between the end point fit straight line and the actual transfer characteristic, and trimming the resistors of the DAC to minimize the error function.

These conventional techniques are effective in the limited case where the errors are due to non-interactive effects between the various resistors of the DAC. This technique does not, however, provide for a minimum number of trims. Since the process of trimming is time-consuming and expensive, it is highly desirous to minimize the number of trims. Additionally, if errors are due to interactive effects between the resistors, the end point fit conventional method does not minimize the mean square error or the peak error between the actual transfer characteristic and the ideal transfer characteristic.

SUMMARY OF THE INVENTION

The present invention is a method and apparatus for minimizing the number of trims necessary to improve the accuracy of a DAC. The present system is superior to conventional error correcting techniques when non interactive errors are present.

The invention utilizes the novel technique of fitting the Walsh terms of the actual transfer characteristic to the Walsh terms of an ideal transfer characteristic in the log domain. In a preferred embodiment of the invention, the binary Walsh terms (the binary Walsh terms are those terms whose order is an integral power of two) of the actual transfer characteristic are generated and stored. The logarithm of the absolute value of these Walsh terms is taken to generate a first set of log domain Walsh terms. This set is termed and the actual set. The logarithm of the absolute values of the Walsh terms of a straight line transfer characteristic are then taken to generate a second set, the ideal set, of log domain Walsh terms. An error range is then selected to determine, by a line fitting technique, the deviation of the terms in the actual set of log domain Walsh terms from the straight line formed by the terms of the ideal set of log domain Walsh terms.

According to one aspect of the invention, the line fitting technique is implemented by the following steps. Two arrays are formed, one generating by adding the error range to each term in the ideal set of log domain Walsh terms and one array formed by subtracting the error range from each term in the ideal set of log domain binary Walsh terms. These two arrays form an acceptable error envelope in the log domain. The envelope is located below the terms in the actual set of log domain Walsh terms by adding or subtracting a constant from each of the envelope terms.

The envelope is then incremented upward and the number of terms in the actual set of binary Walsh terms included in the envelope at each increment are countered and stored in an array. After the envelope has incremented past the last of the terms in the actual set of log domain Walsh terms, the array holding the number of terms in each increment is checked to determine the increment with the largest number of terms included therein. The slope and intercept of the increment including the largest number of terms is then determined. Additionally, the deviation of the terms of the actual set of log domain Walsh terms that are outside of this envelope from the straight line formed by the terms of an ideal characteristic having the calculated slope and intercept provides a measure for the trims necessary to correct the DAC.

According to a further aspect of the invention, a set of Walsh correction terms is generated having values equal to the exponential function of the deviation of the log doamin terms.

In a preferred embodiment of the invention, the above-described method of generating the Walsh correction terms is utilized to calibrate a post correction DAC system. The post correction DAC system includes a correction block for receiving the input digital code and for generating an analog correction signal. The analog correction signal is combined with the DAC output analog signal to form a corrected analog output signal. The amplitude of the corrected output signal depends on the amplitude of the Walsh correction terms. These amplitudes are computed as described above.

DETAILED DESCRIPTION OF THE PREFERRED EMBODIMENT

The present invention is a system for minimizing digital-to-analog converter correction trims to increase the accuracy of the DAC. A complete exposition of the principles underlying the present invention is set forth in an unpublished thesis by one of the inventors entitled "A Method for Correcting Static Digital-To-Analog Converter Errors" which is included in this application as Appendix A.

To better describe the invention, a brief overview of the operation of a typical current switching DAC, typical errors characterizing a current switching DAC, and the Walsh function technique for analyzing the errors of a DAC will be described with reference to FIGS. 1, 2, 3, and 4. The algorithm utilized to implement the present invention will be described with reference to FIG. 6, and a block diagram of a system for implementing the invention will be described with reference to FIG. 7.

Figure 1:
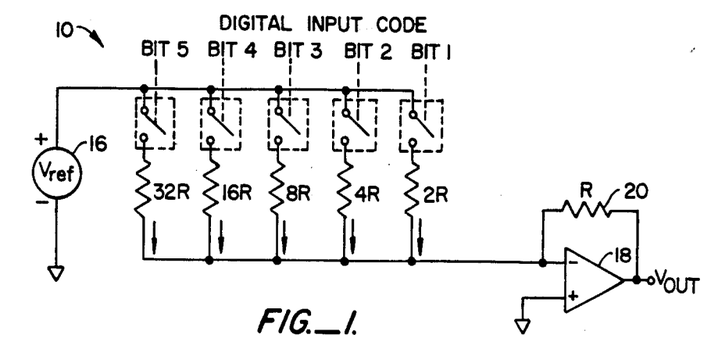
FIG. 1 is a schematic diagram of a current switching DAC.

Referring now to FIG. 1, the current switching DAC 10 includes a plurality of switches 12, a plurality of weighting resistors 14, a voltage reference source 16, an output op-amp 18, and a feed-back resistor 20.

The switches 12 are controlled by the digits in the digital input code. Typically, if the input digit is a 1, the switch is closed and if the input digit is a 0, the switch is open. Thus, when a 1 is present in a particular bit position of the digital code, current will flow through the weighting resistor 14 corresponding to the position of the 1 in the binary input code. The weighting of the resistors 14 is set so that the current flowing through the resistor is proportional to the number encoded by the position of the bit in the input digital code. For example, consider the relationship of the current flowing through the resistor with value 32R and the resistor with value 4R. The switch associated with the 32R resistor is controlled by the digit in bit 5, with the value of the current flowing through the 32R resistor designated on LSB (the current corresponding to the least significant bit of the digital code). The value of current flowing through the resistor 4R will be equal to 8 LSBs since the current is proportional to the value of resistance due to the fact that the reference is a constant and the various resistors are connected between V reference and ground in parallel. Thus, if bit 5 encodes a 1, then bit 2 encodes an 8. Ideally, the decimal value encoded by in the input code will correspond to the current entering the op-amp divided by 1 LSB of current. The op-amp 18 feedback resistor 20 combination converts this current to an output voltage level.

The performance of the DAC is specified by a transfer characteristic which relates the analog output voltage value to the value of the input digital signal. Ideally, this transfer characteristic would be a straight line passing through y=0, however typically the transfer characteristic is specified by the following formula.

$$y(t) = A \sum_{i=0}^{N-1} a_i b_i(t) + M \quad (1)$$

where A is the gain of the DAC, M is the offset or y intercept of the graph of the transfer characteristic, $a_i$ is the weighting factor of bit i, and $b_i$ is equal to 1 when bit i is equal to 1 and 0 otherwise.

Figure 2A:
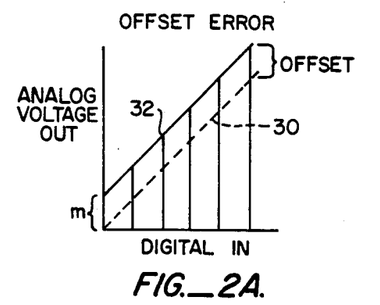
FIGS. 2A through 2D are a set of graphs depicting the static errors of a DAC.

This deviation from a linear relationship determines the error function. FIGS. 2A through 2D illustrate the various parameters for specifying the error function. Referring to those figures, in FIG. 2A the offset error is depicted. The dotted line 30 in each figure represents the ideal transfer characteristic passing through 0 while the solid line 32 represents the actual transfer characteristic of a realizable DAC. In FIG. 2A, the actual transfer characteristic is linear, but the y intercept is offset by the value M from 0.

Figure 2B:
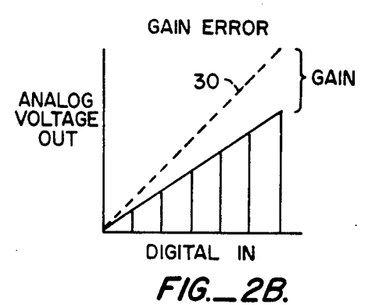

Referring now to FIG. 2B, a gain or range error is depicted. The full scale value is defined as the analog voltage signal corresponding to the maximum value of the digital input signal, typically $(2^N)-1$. The deviation of the full scale value from the predicted end point value is the range error. Another measurement of this error is the deviation of the slope of the actual transfer characteristic from the grain or slope of the ideal transfer characteristic.

Figure 2C:
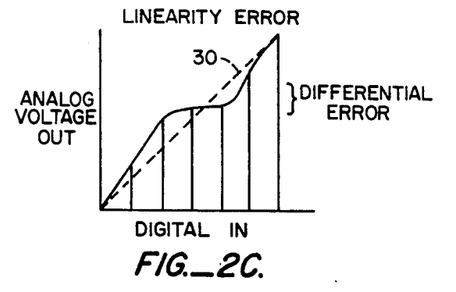

Referring now to FIG. 2C, a linearity error is depicted and the concept of differential error will be described. Nonlinearity is the deviation of the actual transfer characteristic from a straight line drawn through the end points of an actual transfer characteristic but does not include errors due to offset and range. Differential nonlinearity is defined as the difference between two adjacent digital input values from the ideal of plus or minus one LSB expected value of that difference. That is, adjacent digital input values differ by one least significant bit and accordingly the difference between an analog output signal corresponding to those adjacent values should be 1 LSB of voltage.

Figure 2D:
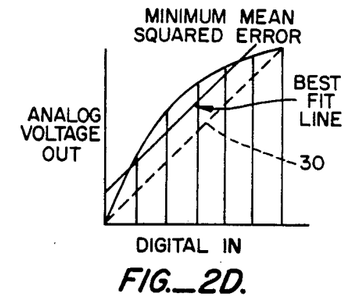

FIG. 2D illustrates an error measure wherein a straight line is fitted to the actual transfer characteristic to minimize the mean square error between the straight line and the actual transfer characteristic. Conventional error correction systems utilize an end point fir to generate laser trims. It is apparent from considering FIG. D, however, that the end point fit does not necessarily minimize the mean square error. Accordingly, improvements to an end point fit are necessary to increase the accuracy of a DAC.

The various error parameters may be reduced by varying the values of the weighting resistors 14 in the DAC 10. This process is termed "trimming" and may be accomplished by high power laser beams or other methods as described, for example, in the book edited by Sheingold entitled *Analog-Digital Conversion Notes*, Analog Devices, 1977. This trimming process is expensive and time-consuming and it therefore is highly desirable to minimize the number of weighting resistors that must be trimmed to reduce the error function to specified limits.

In conventional methods of error correction utilizing an end fit, these trims are implemented to reduce the deviation of the actual error function from a straight line drawn through the end points of the actual error function. As described more fully in Appendix A, the transfer characteristic may be represented by a sum of weighted Walsh functions with the weighting factor of each Walsh function corresponding to the contribution of a particular weighting resistor to the overall actual transfer characteristic. This Walsh technique will be described more fully below with reference to FIG. 5.

In the present system, a post correction technique is utilized. A block diagram for implementing this post correction is depicted in FIG. 5A. This post correction system by one of the applicants in a paper entitled "Applications of Walsh Functions to Converter Testing," Digest of Papers, 1980, Test Conference, Nov. 1980. In FIG. 5A, the digital input code is supplied to the inputs of the DAC 10 and a correction block 60. The correction block 60 generates an analog correction signal. The analog correction signal and DAC output signal are combined at a summing element 62 to generate a corrected analog output signal.

In the correction block 60, a set of Walsh correction terms are stored and utilized to generate the analog correction signal. A system for generating these Walsh correction terms and specific implementations of the correction block 60 are described below.

Figure 3A:
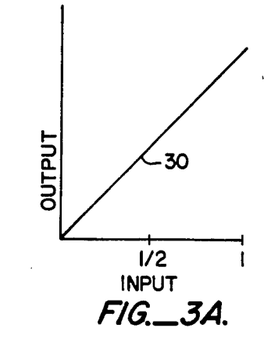
FIGS. 3A through 3C are graphs depicting an ideal transfer curve, an MSB error curve, and an MSB error cure having an end fit line superimposed, respectively.
Figure 3B:
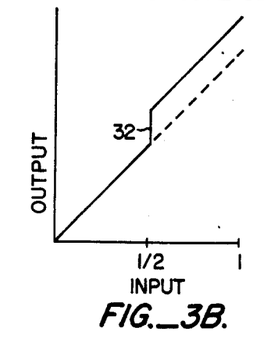
Figure 3C:
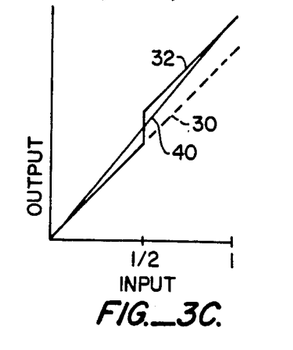

A simple example of the conventional error reduction method will now be described with reference to FIGS. 3A through 3F to illustrate the problems inherent in these conventional methods. FIGS. 3A through 3C illustrate the transfer characteristic and end point fit line of a device that has a linear error in the weighting resistor with value R which corresponds to a linear error in the most significant bit (MSB) of the DAC 10. FIG. 3A illustrates the ideal transfer characteristic curve of a DAC. FIG. 3B illustrates the actual transfer characteristic of a DAC having a linear MSB error. Note that the transfer characteristic of the device increases from the ideal value for a digital input equal to, or greater than, one-half the maximum digital input of the device, which corresponds to the value $2^N$ divided by 2. The switch corresponding to the MSB weighting resistor, resistor value 2R, is turned on at this value and remains on for all subsequent values. FIG. 3C depicts the ideal transfer characteristic 30, the actual transfer characteristic 32, and a straight line connecting the end points of the actual transfer characteristic 40.

Figure 3D:
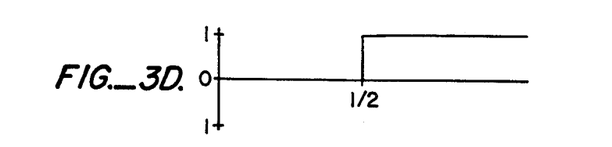
FIGS. 3D through 3F are graphs depicting the error curve, end point fit error curve, and mean square fit error curve for the error depicted in FIG. 3B.

FIG. 3D illustrates the error function which depicts the difference between the actual transfer characteristic 32 and the ideal transfer characteristic 30. From the graph represented in Appendix A, it is apparent that this error function can be easily obtained by inverting an offsetting the first Walsh function. Thus the principle stated above, that the contribution from each weighting resistor may be represented by the Walsh function, is illustrated in FIG. 3D. Accordingly, the error function could be reduced to 0 by trimming of the value of the resistor corresponding to the MSB of the input digital code. Thus, the error function depicted in FIG. 3D could be totally eliminated by trimming only one resistor.

Conventional error correction techniques, however, result in several trims being required to reduce the error function depicted in FIG. 3A. This problem is illustrated in FIG. 3E in the case of an end point fit technique and in FIG. 3F for the case of a least mean square error fit technique.

Figure 3E:
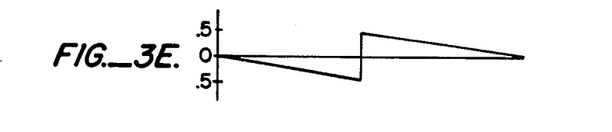
Figures 3F, 7:
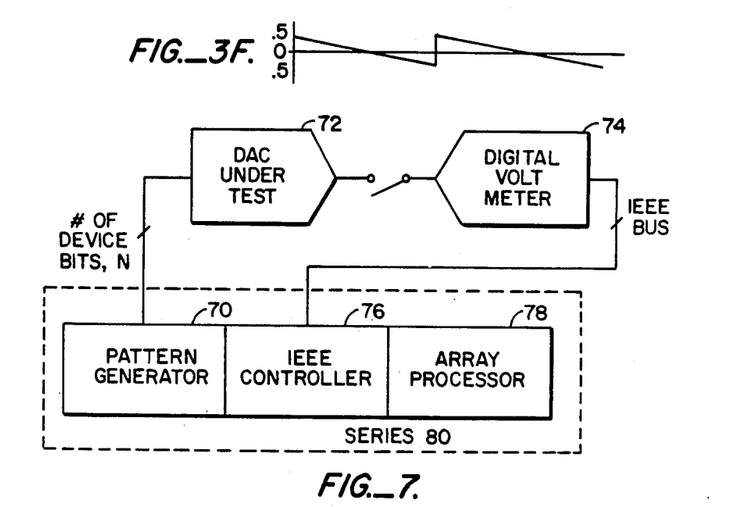
FIG. 7 is a block diagram depicting a preferred embodiment of an apparatus for implementing the method of the present invention.

Referring now to FIG. 3E. the error function, being the difference between the end point fit straight line and the actual transfer characteristic 32, is depicted. Since this error function does not correspond to any particular Walsh function, a linear combination of Walsh functions is required to approximate the error function. The coefficients of the Walsh terms required to fit this function are set forth in Appendix A. A significant number of trims is required to reduce the error function to 1 LSB. Similarly, FIG. 3F depicts the mean square error function and the Walsh coefficients required to fit this function are also depicted in Appendix A. The present invention provides a unique system for identifying which weighting resistors are contributing to the error in the actual transfer characteristic. To fully understand the concept of the present invention, a brief description of the Walsh decomposition of a transfer characteristic will now be described with reference to FIGS. 4A and 4B. For an N bit ideal transfer characteristic the Walsh expansion is given by the following equation:

$$x[n] = -A \sum_{i=0}^{N-1} 2^{-(i+2)} \psi_{(2i)}[n] + [A(2^N - 1)/2^{N+1} + M/2] \psi_0 \qquad (2)$$

where A is the gain of the device and M is the offset. Thus, each of the non-zero binary terms is:

$$\alpha_{(2i)} = -A \, 2^{-(i+2)}$$

and the zeroeth order term is:

$$\alpha_0 = \frac{A(2^N - 1)}{2^{N+1}} + \frac{M}{2}$$

Figure 4A:
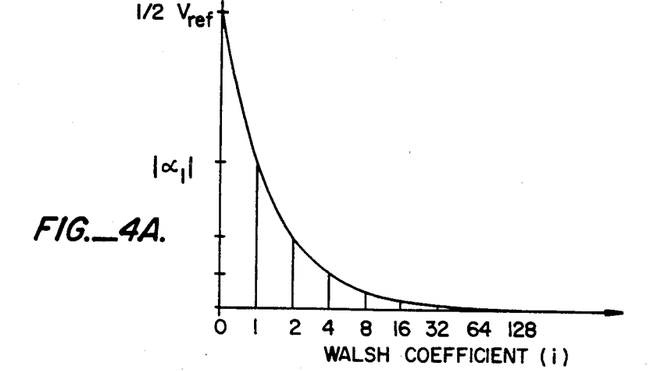
FIG. 4A is a graph depicting the amplitudes of the Walsh terms of an ideal transfer characteristic.

These Walsh coefficients for the ideal transfer characteristics are graphed in FIG. 4A for an eight bit DAC. Note that the graph is a typical exponential function. If the log base 2 is taken of the absolute value of the Walsh terms set forth above, then the following relationships result:

$$\log_2 |\alpha_i| = \log_2(A) - i - 2 = \beta_i, i \neq 0 \quad (3)$$

$$\log_2 \alpha_0 = \log_2(A) + \log_2(2^N - 1) - \log_2(2^{N+1}) \quad (4)$$
$$= \beta_0, M = 0$$

$$\log_2 \alpha_0 = \log_2\left\{\frac{A(2^N - 1)}{2^{N+1}} + \frac{M}{2}\right\} = \beta_0, M \neq 0 \quad (5)$$

Figure 4B:
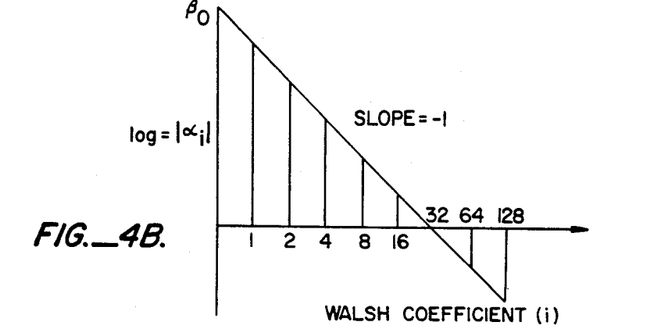
FIG. 4B is a graph depicting the amplitudes of the Walsh terms of an ideal transfer coefficient in the log domain.

The log base 2 of the absolute values of the Walsh terms are graphed in FIG. 4B. Here, the non-zero Walsh terms are related with a slope of a negative 1 and the intercept is determined by the slope of the original transfer characteristic. Changing the slope of the transfer characteristic will only raise or lower the straight line of FIG. 4B. It is the recognition of the linear relationship between the Walsh terms in the log domain that is the basis for the novel fitting technique of the present invention. Graphical analysis in which the log base 2 of Walsh terms is utilized is termed analysis in the log domain.

Figure 5:
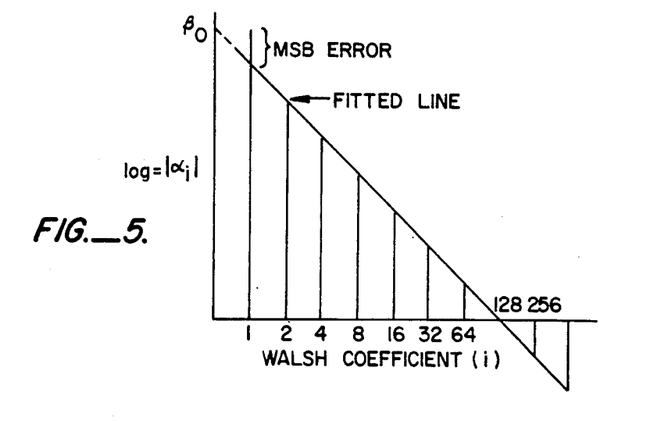
FIG. 5 is a graph depicting an MSB error in the log domain.
Figure 5A:
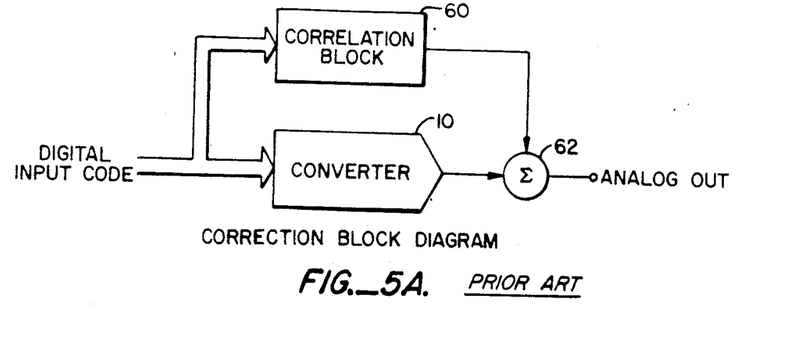
FIG. 5A is a block diagram of a DAC post correction system.

The advantages of error reduction in the log domain are illustrated in FIG. 5 with respect to the error described above with reference to FIGS. 3A through 3F. For an MSB error the only Walsh term that deviates from the ideal is the term corresponding to the first Walsh function, i.e., $\alpha_1$. This error is depicted in FIG. 5. Note that the remaining Walsh terms correspond to the straight line in the log domain. If a straight line were fit to pass through the straight line formed by the non-MSB Walsh terms, then the precise magnitude of the MSB would be provided. Accordingly, only a trim corresponding to the MSB weighting resistor would be required to fit the actual transfer characteristic to the ideal transfer characteristic in this example.

This example illustrates the dominant term concept, i.e., that a limited number of Walsh terms may describe the error characteristic of the DAC. Further, test data establishes that this error characteristic may be described by low order Walsh correction terms. Additionally, once this fit had been obtained the values of the Walsh coefficients in the log domain could be utilized to calculate the slope and offset of the actual transfer characteristic by utilizing the following formulas:

$$A = \exp[(\beta_i + 2 + i)/\ln 2] \quad (6)$$

$$M = 2\exp[(\beta_0/\ln 2] - \frac{A(2^N - 1)}{2^N} \quad (7)$$

where $\beta_i$ and $\beta_0$ are calculated from equations (3) and (4), respectively.

Figure 6:
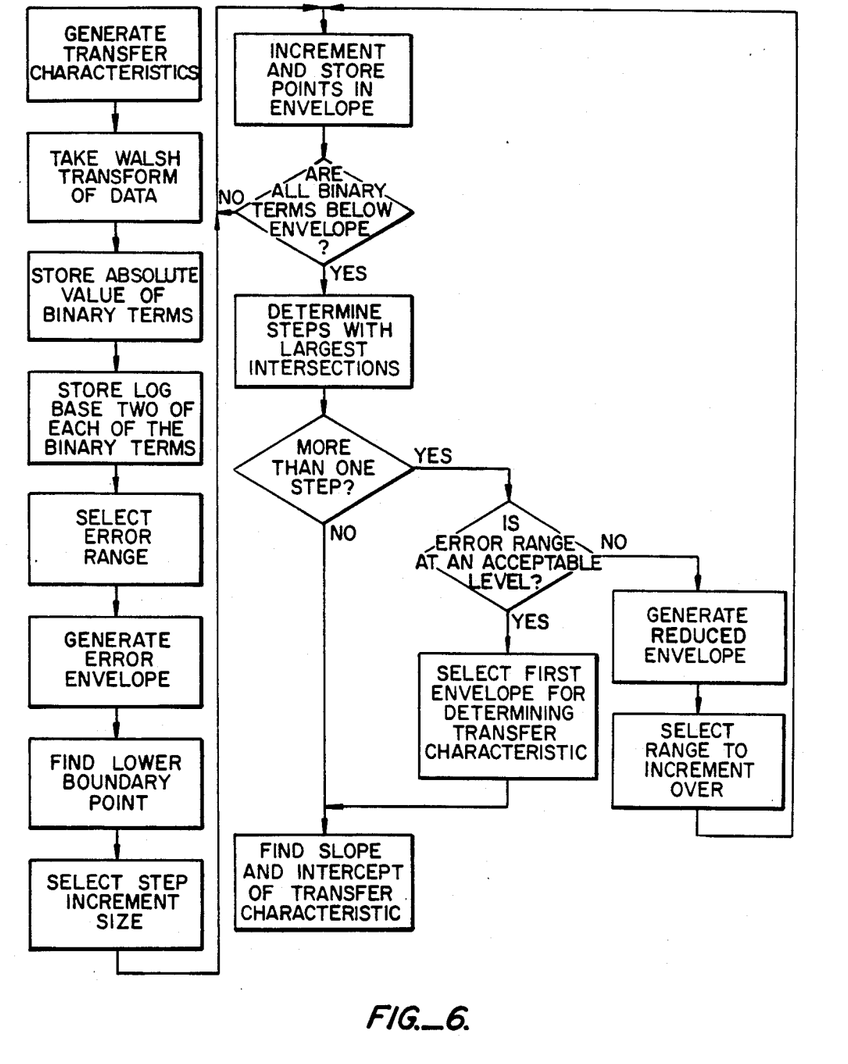
FIG. 6 is a block diagram illustrating a preferred method of the present invention.

As described above, the present invention determines the error in the Walsh terms by fitting the Walsh terms to a straight line in the log domain. FIG. 6 is a flow diagram of an algorithm for fitting the linear transfer characteristic in the log domain to minimize the number of terms outside a given error band. Referring now to FIG. 6, the transfer characteristic of the DAC is first generated by stepping the device through all or part of its states, i.e., sequentially generating digital input codes corresponding to all possible values, reading the analog value of the device output at each state, and storing the data array obtained in a file in a computer memory.

A Walsh transform is then taken of this data to generate the set of binary Walsh terms characterizing the actual transfer characteristic of the DAC. The log base 2 of the absolute value of each Walsh term in this set is then taken to generate a set of log domain Walsh terms.

An error range must then be determined. The value of this error range is determined by the deviation of the actual transfer characteristic from an ideal transfer characteristic that is desired. For example, if the deviation from the ideal is to be less than one-half of an LSB, then the acceptable error range might be ⅛th of an LSB. The value of the error range is then used to generate an acceptable error envelope in the log domain for fitting the Walsh terms to a straight line in the log domain.

Generation of this envelope is accomplished by the following steps: First, select a dummy slope for the test transfer characteristic to position the fitting line in the log domain at a selected point on the y axis in the log domain; second, generate two envelope arrays, a first envelope array being generated by adding the error range to each of the binary Walsh terms of the ideal transfer characteristic, and the second fitting array being generated by subtracting the error range from the binary Walsh terms of the ideal transfer characteristic; and, third, taking the base log 2 of each fitting array and storing these values in a computer memory.

The error range determines the boundary of the envelope, while the slope chosen determines the y intercept of the envelope. Thus, choosing a dummy slope to start with simply positions the envelope at a given y axis location in the log domain. Accordingly, the dummy slope is chosen to position the envelope below all the points of the set of log domain Walsh terms corresponding to the actual transfer characteristic. The envelope is then incremented upward and the number of terms in the set of log domain Walsh terms corresponding to the actual transfer characteristic included in the envelope at each increment is determined and stored in a separate file. Since incrementing the envelope corresponds to increasing the slope of the ideal transfer characteristic, the size of the increment is determined by how fine of a slope change in the transfer characteristic is desired.

After the envelope has been incremented past all of the terms in the set of log domain Walsh terms corresponding to the actual transfer characteristic, the array holding the number of terms in each increment is checked to determine the increment with the largest number of terms. The increment state with the largest number of terms is then used to select a slope and intercept that minimizes the number of binary terms corrected. The deviation of the terms in the set of log domain Walsh terms from this best fit straight line is then an indication of the magnitude of the trims that must be implemented to reduce the deviation of the actual transfer characteristic of the DAC from the ideal transfer characteristic, determined from the fitting technique described above, to the acceptable error range desired.

From equations (3)-(5) it is apparent that the magnitudes of the Walsh correction, alpha$_i$, are equal to exponential, base 2, of these deviations in the log domain.

A system for implementing the above-described line fitting algorithm in the log domain will now be described with reference to FIG. 7. FIG. 7 is a block diagram depicting the various functions of the system. A pattern generator 70 is connected to the input of a DAC under test 72. This pattern generator sequentially generates the possible values of the input digital code to step the DAC through its entire input arrays. The analog output of the DAC corresponding to each input state is measured by a digital volt meter 74. The digital volt meter 74 is controlled and read by an IEEE interface bus 76. The data obtained from the digital volt meter 74 is stored in the memory of an array processor 78 for processing to implement the line fit algorithm. In practice, the digital volt meter utilized was a Hewlett-Packard, Model 3665 digital volt meter. The pattern generator 70 IEEE interface 76 and array processor 78 utilized were the functional components of A Fairchild Series 80 analog test system.

Figure 8:
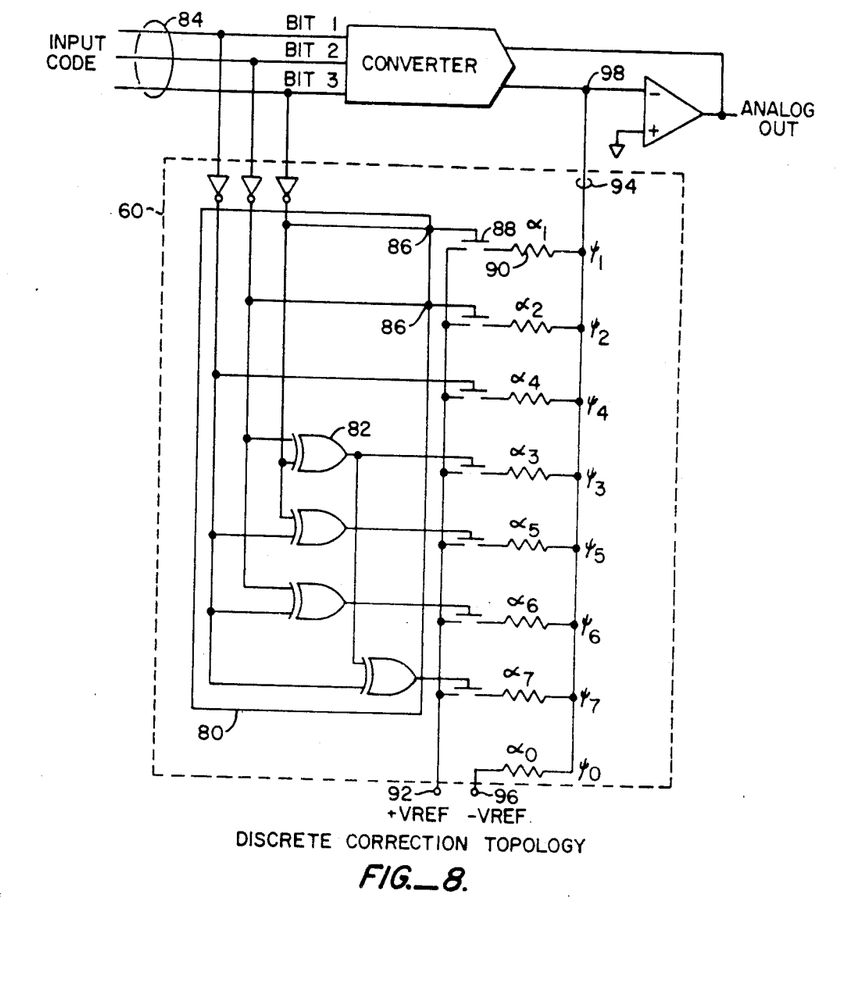
FIG. 8 is a schematic diagram of a discrete correction topology.

FIG. 8 is a schematic diagram of a particular embodiment of the post correction systems depicted in FIG. 5A. In FIG. 8, an array 80 of exclusive/or (XOR) gates 82 is coupled to a first digital bus 84. The first digital bus 84 is also coupled to the input port of DAC 10. Output ports 86 of the XOR array 80 activate switches 88 that couple the first terminals of weighting resistors 90 to a +VREF terminal 92. The second terminals of the weighting resistors 90 are coupled to a correction line 94 coupling the DAC output to a −VREP terminal 96. The correction line 94 and DAC output are coupled at summing node 98.

The XOR array 60 converts the digital input code to a Walsh input code. In FIG. 8, a three-bit input code is converted to an eight-bit Walsh code. The non-zero terms in the Walsh code indicate the particular Walsh terms that contribute to the value of the DAC transfer characteristic for each digital input code.

The amplitudes, $alpha_i$, of the weighting resistors are multiples of the Walsh correction terms for the DAC 10.

The Walsh term corresponding to each weighting resistor are listed in FIG. 8. For a given input code, the switches 88 for the contributing Walsh terms are closed and current flows through the corresponding weighting resistors 90.

The sum of the voltage drops across these resistors 90 is the analog correction signal for the given digital code. The combination of the DAC output signal and the analog correction signal is the corrected analog output signal.

Figure 9:
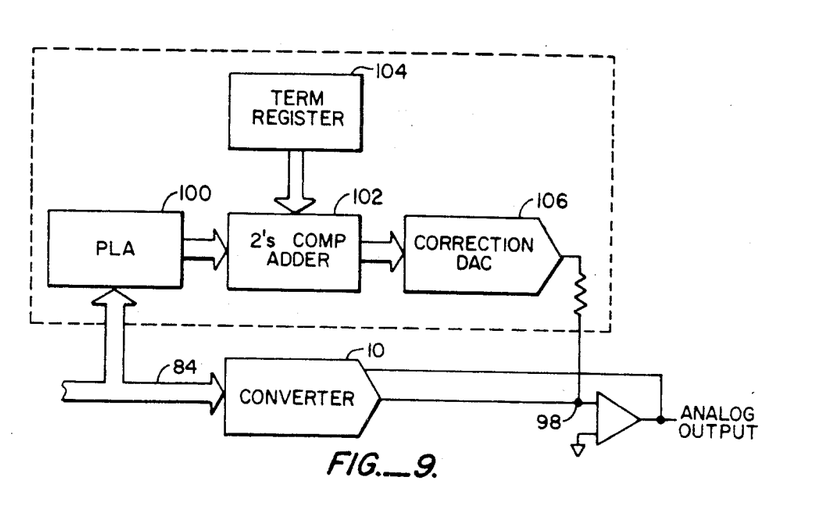
FIG. 9 is a schematic diagram of a modular system.

FIG. 9 is a schematic diagram of another embodiment of the post correction system of FIG. 5A. In FIG. 9, the first digital input bus 84 is coupled to the input ports of programmable logic array (PLA) 100 and a DAC 10. A 2's compliments adder 102 has inputs coupled to the output port of the PLA 100 and the output port of a term register 104. The output port of the adder 102 is coupled to the input port of a correction DAC 106. The output ports of the DAC and correction DAC are coupled at a summing node 98.

The PLA 100 implements the XOR array for converting the input digital code to the digital Walsh code. The Walsh correction terms are stored in the term register 104. For a given input code, those correction terms corresponding to non-zero terms in the digital Walsh code are added in the 2's compliment adder to form a digital correction code. This digital correction term is converted to an analog correction signal by the correction DAC 106. The analog correction signal and DAC output signal are combined at the summing node 98 to form the corrected analog output signal.

Figure 10:
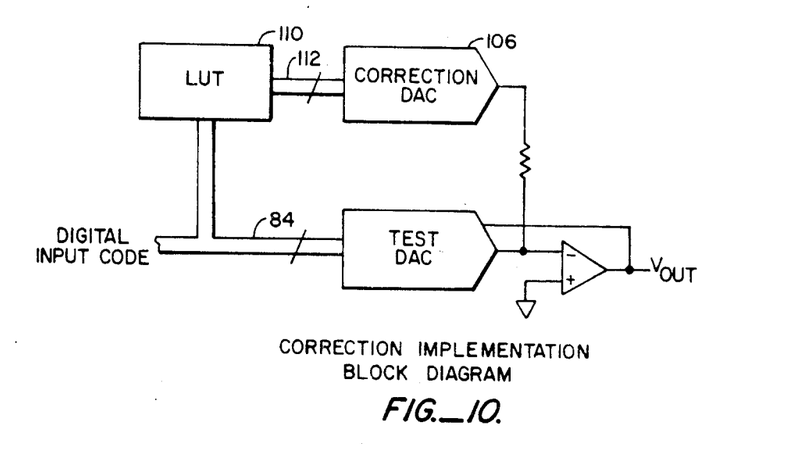
FIG. 10 is a schematic diagram of a system utilizing a LUT.

FIG. 10 is a schematic diagram of still another implementation of the post correction system of FIG. 5. In FIG. 10, the first digital bus 84 is coupled to the input port of a look-up table (LUT) 110 and to the input port of the DAC 10. The output port of the LUT 110 and input port of the correction DAC are coupled by a second digital bus 112. The output ports of the DAC and correction DAC are coupled at the summing node 98.

The digital correction terms for each value of the input digital code are computed and stored in the LUT 110 at the storage location accessed by the corresponding input code. These terms are transferred to the correction DAC 106 to generate the analog correction signal for the corresponding input code.

In the embodiment described with reference to FIG. 7, the LUT 110 may be implemented in the memory of the series 80 test system. Thus, the system utilized to calculate the Walsh correction terms may also be utilized to implement post correction.

In each of the embodiments described with reference to FIGS. 8–10, the post correction system must be calibrated by providing the values of Walsh correction terms to post correction block. These terms are computed utilizing the steps described with reference to FIG. 6.

The preferred embodiment has been described in terms of a specific line fitting algorithm and the system for implementing the logarithm has been described with respect to specific electronic components. However, it is obvious to a person of ordinary skill in the electronic art that variations in the above-described embodiment could be implemented to utilize the invention. For example, alternative line fitting algorithms are well known and described, for example, in the book by Hastings entitled *Approximations for Digital Computers*, Princeton Univ. Press (Princeton, 1955) and the book by Freund entitled *Dicitionaly/Outline of Basic Statistics*, McGraw-Hill, NY 1966. Additionally, alternative digital circuitry for implementing the algorithm would be obvious to a person of ordinary skill in the art. Further, although the embodiment described above was described with reference to a particular DAC topology it is emphasized that the principles of the invention may be applied to DACs having different topologies than described above. For example, the DAC may be an R−2R current weighting network or assume other topologies such as described in the above referenced book edited by Sheingold.

Additionally, several specific embodiments of a correction system for utilizing the Walsh correction terms have been described. Other systems for utilizing these correction terms to compensate for DAC errors will now be apparent to persons skilled in the art.

Therefore, the scope of the invention is not limited by the above-described embodiments but rather is defined by the appended claims.

What is claimed is:

1. In a DAC post-correction system that utilizes stored correction terms for generating an analog correction signal, a process for calibrating said correction system comprising:
generating the actual transfer characteristic of the DAC;

performing a Walsh transform of the actual transfer characteristic to generate a first set of binary Walsh terms;

transforming the Walsh terms in said first set into the log domain by taking the log of the absolute value of each term in said first set of Walsh terms to generate a set of log domain Walsh terms;

generating a second set of log domain Walsh terms corresponding to a linear transfer characteristic with the terms in said second set being on a straight line in the log domain having an intercept determined by the slope of said linear transfer characteristic;

fitting said first set of log domain terms to said straight line corresponding to said second set of log domain Walsh terms to determine the deviation of a given term in said first set from said straight line;

taking the exponential of said deviation in the log domain to generate a set of Walsh correction terms indicating the magnitude of the error of a corresponding Walsh term in the first set; and adjusting the values of said stored correction terms to equal the values of said Walsh correction terms.

2. A process for calibrating a post correction DAC system of the type having a DAC for converting an input digital code to an analog output signal, a LUT for generating a digital correction code for each digital input code, and a correction DAC for converting the digital correction code to an analog correction signal, a summing element for combining the analog output and correction signal to form a corrected analog signal, said process comprising the steps of:

generating the actual transfer characteristic of the DAC;

performing a Walsh transform of the actual transfer characteristic to generate a first set of binary Walsh terms;

transforming the Walsh terms in said first set into the log domain by taking the log of the absolute value of each term in said first set of Walsh terms to generate a set of log domain Walsh terms;

generating a second set of log domain Walsh terms corresponding to a linear transfer characteristic with the terms in said second set being on a straight line in the log domain having an intercept determined by the slope of said linear transfer characteristic;

fitting said first set of log domain terms to said straight line corresponding to said second set of log domain Walsh terms to determine the deviation of a given term in said first set from said straight line;

taking the exponential of said deviation in the log domain to generate a set of Walsh correction terms indicating the magnitude of the error of a corresponding Walsh term in the first set;

generating a Walsh code having non-zero terms identifying the particular Walsh terms in said first set that contribute to the value of the DAC transfer characteristic for a given input digital code;

digitally summing the Walsh correction terms corresponding to the Walsh terms in said first set identified by the non-zero terms of said Walsh code to generate the correction code for said given input code; and storing the correction code for the given input digital code in the LUT location accessed by the given input digital code.

3. A process for calibrating a post correction DAC system of the type having a DAC for converting an input digital code to an analog output signal, a programmed PLA for converting a given digital code to a Walsh code, where the non-zero terms in said Walsh code indicate which Walsh terms are included in the analog output signal for the given code, a term register for storing a set of Walsh correction terms characterizing the DAC, an adder, having input ports coupled to the output ports of the term register, for adding the Walsh correction terms specified by non-zero terms of the Walsh code to generate a correction code, a correction DAC for converting the correction code to an analog correction signal and a summing element for combining the analog output and correction signals to form a corrected analog signal, said process comprising:

generating the actual transfer characteristic of the DAC;

performing a Walsh transform of the actual transfer characteristic to generate a first set of binary Walsh terms;

transforming the Walsh terms in said first set into the log domain by taking the log of the absolute value of each term in said first set of Walsh terms to generate a set of log domain Walsh terms;

generating a second set of log domain Walsh terms corresponding to a linear transfer characteristic with the terms in said second set being on a straight line in the log domain having an intercept determined by the slope of said linear transfer characteristic;

fitting said first set of log domain terms to said straight line corresponding to said second set of log domain Walsh terms to indicate the deviation of a given term in said first set from said straight line;

taking the exponentials of said deviations in the log domain to generate a set of Walsh correction terms indicating the magnitude of the error of a corresponding Walsh term in the first set; and storing said Walsh terms in the storage locations of the said term register.

4. A process for calibrating a post correction DAC system of the type having a DAC for converting an input digital code to an analog output signal, an XOR network for converting a given digital code to a Walsh code, where the non-zero terms in said Walsh code indicate which Walsh terms are included in the analog output signal for the given code, a set of weighting resistors having variable resistance values, a set of switches, activated by the non-zero terms of the Walsh code, for coupling said weighting resistors to a voltage reference where the sum of the voltage drops across resistors coupled to the voltage reference is an analog correction signal, and a summing element for combining the analog output and correction signal to form a corrected analog signal, term register for storing a set of Walsh correctio terms characterizing the DAC, an adder, having input ports coupled to the output ports of the term register, for adding the Walsh correction terms specified by non-zero terms of the Walsh code to generate a correction code, a correction DAC for converting the correction code to an analog correction signal and a summing element for combining the analog output and correction signals to form a corrected analog signal, said process comprising:

generating the actual transfer characteristic of the DAC;

performing a Walsh transform of the actual transfer characteristic to generate a first set of binary Walsh terms;

transforming the Walsh terms in said first set into the log domain by taking the log of the absolute value of each term in aid first set of Walsh terms to generate a set of log domain Walsh terms;

generating a second set of log domain Walsh terms corresponding to a linear transfer characteristic with the terms in said second set being on a straight line in the log domain having an intercept determined by the slope of said linear transfer characteristic;

fitting said first set of log domain terms to said straight line corresponding to said second set of log domain Walsh terms to indicate the deviation of a given term in said first set from said straight line;

taking the exponentials of said deviations in the log domain to generate a set of Walsh correction terms indicating the magnitude of the error of a corresponding Walsh term in the first set; and adjusting the values of the resistance of said weighting resistors to be equal to the value of said Walsh correction terms.

* * * * *